United States Patent
Heo et al.

(10) Patent No.: US 10,411,224 B2
(45) Date of Patent: Sep. 10, 2019

(54) DISPLAY DEVICE WITH ANTI-REFLECTION LAYER, AND ELECTRONIC DEVICE WITH THE SAME

(71) Applicant: Samsung Electronics Co., Ltd, Suwon-si (KR)

(72) Inventors: Jihun Heo, Suwon-si (KR); Ji Hoon Park, Suwon-si (KR); Sung-Soo Moon, Suwon-si (KR); Kemsuk Seo, Yongin-si (KR); Taeyoon An, Suwon-si (KR); Bong Jae Rhee, Suwon-si (KR); Chang-Su Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/937,693

(22) Filed: Mar. 27, 2018

(65) Prior Publication Data
US 2018/0277798 A1    Sep. 27, 2018

(30) Foreign Application Priority Data

Mar. 27, 2017 (KR) .................. 10-2017-0038513

(51) Int. Cl.
*H01L 51/52* (2006.01)
*H01L 27/32* (2006.01)
(Continued)

(52) U.S. Cl.
CPC ............ *H01L 51/5281* (2013.01); *B32B 7/12* (2013.01); *B32B 17/06* (2013.01); *H01L 27/323* (2013.01); *H01L 27/3244* (2013.01); *H01L 51/0097* (2013.01); *B32B 2255/00* (2013.01); *B32B 2307/412* (2013.01); *B32B 2307/42* (2013.01);
(Continued)

(58) Field of Classification Search
CPC ............ H01L 51/5281; H01L 51/0097; H01L 27/323; H01L 27/3244; H01L 51/5293; H01L 2251/5338; B32B 17/06; B32B 7/12; B32B 2307/42; B32B 2307/412; B32B 2255/00; B32B 2457/206; H04M 1/0266
See application file for complete search history.

(56) References Cited

U.S. PATENT DOCUMENTS

2005/0140265 A1*  6/2005  Hirakata ............. H01L 51/5259
                                                            313/483
2009/0261718 A1* 10/2009  Ha ....................... H01L 51/5237
                                                            313/504
(Continued)

*Primary Examiner* — Karen Kusumakar

(57) ABSTRACT

The present disclosure relates to an electronic device with a display device having enhanced display power consumption. The electronic device includes: a housing; a transparent member disposed in at least a portion of the housing, and includes an upper surface and a lower surface; a first anti-reflection layer coupled to the upper surface of the transparent member; and a display panel coupled to at least a portion of the lower surface of the transparent member by a visually transparent adhesive member, and housed in the housing. The display panel includes: a polarizing film layer coupled to the adhesive member and including an upper surface and lower surface; a light emitting layer disposed under the lower surface of the polarizing film layer; and a second anti-reflection layer disposed on the lower surface of the polarizing film layer between the lower surface of the polarizing film layer and the light emitting layer.

20 Claims, 16 Drawing Sheets

(51) Int. Cl.
*H01L 51/00* (2006.01)
*B32B 7/12* (2006.01)
*B32B 17/06* (2006.01)
*H04M 1/02* (2006.01)

(52) U.S. Cl.
CPC ..... *B32B 2457/206* (2013.01); *H01L 51/5293* (2013.01); *H01L 2251/5338* (2013.01); *H04M 1/0266* (2013.01)

(56) References Cited

U.S. PATENT DOCUMENTS

| | | | | |
|---|---|---|---|---|
| 2010/0079708 | A1* | 4/2010 | Takahashi | G02B 5/0221 349/96 |
| 2012/0280373 | A1* | 11/2012 | Feng | H01L 29/4908 257/649 |
| 2015/0338693 | A1* | 11/2015 | Lim | G02F 1/13338 349/12 |
| 2016/0349435 | A1* | 12/2016 | Hsiao | G02F 1/1335 |

* cited by examiner

DISPLAY DEVICE WITH ANTI-REFLECTION LAYER, AND ELECTRONIC DEVICE WITH THE SAME

CROSS-REFERENCE TO RELATED APPLICATION(S)

This application is based on and claims priority under 35 U.S.C. § 119 to Korean Patent Application No. 10-2017-0038513, filed on Mar. 27, 2017, in the Korean Intellectual Property Office, the disclosure of which is incorporated by reference herein in its entirety.

TECHNICAL FIELD

The present disclosure relates to a display device with an anti-reflection layer and an electronic device with the same.

BACKGROUND

Portable electronic devices such as smart phones have displays disposed on front surfaces thereof to allow users to view displayed data. Such a display is provided with a touch sensitive panel and thus may operate as a touch screen.

The above information is presented as background information only to assist with an understanding of the present disclosure. No determination has been made, and no assertion is made, as to whether any of the above might be applicable as prior art with regard to the present disclosure.

SUMMARY

However, a related-art display may have a polarizing film having a transmissivity of 43-44% mounted therein, and may block more than half of whole brightness of the display, and thus current consumption of a display panel may increase. In particular, a display panel mounted in an electronic device may consume very great driving electric current, and therefore, there is a need for reducing a driving current of a display panel.

Embodiments of the present disclosure provide a display device with an anti-reflection layer, which minimizes current consumption of a display panel by applying one or more anti-reflection coating layers.

Embodiments of the present disclosure provide a display device with an anti-reflection layer, which has enhanced visibility and brightness outdoors, and an electronic device with the same.

According to various embodiments of the present disclosure, an electronic device may include: a housing; a transparent member which is disposed in at least a portion of the housing, and includes an upper surface and a lower surface; a first anti-reflection layer which is coupled to the upper surface of the transparent member; and a display panel which is coupled to at least a portion of the lower surface of the transparent member by using a visually transparent adhesive member, and is housed in the housing, and the display panel may include: a polarizing film layer coupled to the adhesive member and including an upper surface and a lower surface; a light emitting layer disposed under the lower surface of the polarizing film layer; and a second anti-reflection layer disposed on the lower surface of the polarizing film layer between the lower surface of the polarizing film layer and the light emitting layer.

According to various embodiments of the present disclosure, an electronic device may include: a front surface transparent window including an outer surface and an inner surface; and a display panel coupled to the inner surface of the front surface transparent window by using a visually transparent adhesive member, and a first anti-reflection layer may be disposed on the front surface transparent window, and a second anti-reflection layer may be disposed on the display panel.

According to various embodiments of the present disclosure, a display device may include: a transparent member having a first surface in a first direction, and having a second surface in a second direction opposite the first direction; a first anti-reflection layer disposed on the first surface of the transparent member; and a display panel coupled to at least a portion of the second surface of the transparent member by using a visually transparent adhesive member, and the display panel may include: a polarizing film coupled to the adhesive member, and having a first surface in the first direction and a second surface in the second direction opposite the first direction; a light emitting layer disposed under the second surface of the polarizing film layer; and a second anti-reflection layer disposed on the second surface of the polarizing film between the second surface of the polarizing film and the light emitting layer.

According to various embodiments of the present disclosure, an electronic device may include: a housing; a transparent member disposed in at least a portion of the housing, and including an upper surface and a lower surface; a first anti-reflection layer coupled to the upper surface of the transparent member; and a display panel coupled to at least a portion of the lower surface of the transparent member by using a visually transparent adhesive member, the display panel being housed in the housing, and the display panel may include: a polarizing film coupled to the adhesive member and including an upper surface and a lower surface; a light emitting layer disposed under the lower surface of the polarizing film; and a second anti-reflection layer coupled to the light emitting layer between the lower surface of the polarizing film and the light emitting layer.

According to various embodiments of the present disclosure, current consumption of the display panel mounted in the electronic device is reduced, outdoor visibility and brightness are enhanced, and there is an effect of color, material, and finishing (CMF).

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
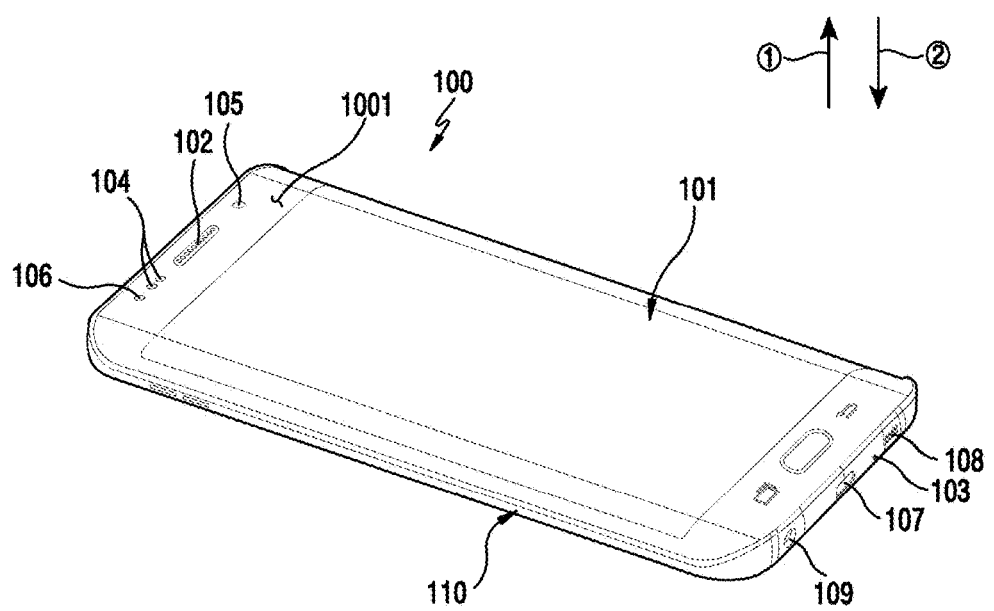
FIG. 1 is a perspective view showing a front surface of an electronic device according to various embodiments.

FIGS. 1 through 16, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the present disclosure will be described with reference to accompanying drawings. However, various embodiments of the present disclosure are not limited to specific embodiments, and it should be understood that modification, equivalent, and/or alternative on the various embodiments described herein can be variously made. With regard to description of drawings, similar components may be marked by similar reference numerals.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used herein, may refer to various elements of various embodiments of the present disclosure, but do not limit the elements. For example, such terms do not limit the order and/or priority of the elements. Furthermore, such terms may be used to distinguish one element from another element. For example, "a first user device" and "a second user device" indicate different user devices regardless of the order or priority. For example, without departing from the scope of the present disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term "configured to (or set to)" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the present disclosure are used to describe specified embodiments of the present disclosure and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

Figure 2:
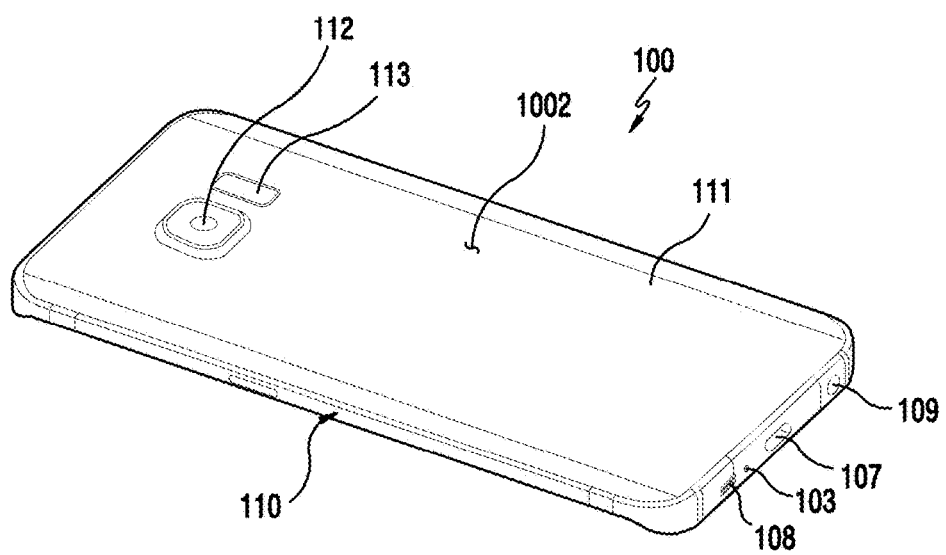
FIG. 2 is a perspective view showing a rear surface of the electronic device according to various embodiments.

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development FIG. 1 is a perspective view showing a front surface of an electronic device according to various embodiments of the present disclosure. FIG. 2 is a perspective view showing a rear surface of the electronic device according to various embodiments of the present disclosure. An orthogonal coordinate system is used, wherein an X-axis direction refers to a horizontal direction of the electronic device, a Y-axis direction refers to a vertical direction of the electronic device, and a Z-axis direction refer to a thickness direction of the electronic device.

Referring to FIGS. 1 and 2, the electronic device 100 according to various embodiments may include a display 101 disposed on a first surface 1001 (for example, a front surface). The display 101 according to various embodiments may include a touch sensor and may operate as a touch screen device. The display 101 according to various embodiments may include a force sensor and may operate as a force sensitive touch screen device.

The electronic device 100 according to various embodiments may include a receiver 102 disposed to output other person's voice. The electronic device 100 according to various embodiments may include a microphone device 103 disposed to transmit a user's voice to the other person.

The electronic device 100 according to various embodiments may have components arranged on the periphery of the receiver 102 to perform various functions of the electronic device 100. The components may include at least one sensor module 104. The sensor module 104 may include at least one sensor of, for example, an illuminance sensor (for example, an optical sensor), a proximity sensor (for example, an optical sensor), an infrared sensor, an ultrasonic sensor, a fingerprint recognition sensor, or an iris recognition sensor. The components according to various embodiments may include a front facing camera device 105. According to various embodiments, the components may include an indicator (for example, a light emitting diode (LED) device) for indicating state information of the electronic device for the user.

The electronic device 100 according to various embodiments may include a speaker device 108 disposed at one side of the microphone device 103. The electronic device 100 may include an interface connector port 107 disposed at the other side of the microphone device 103 to perform a data exchange function with an external device and to receive external power and to charge the electronic device 100. The electronic device 100 according to various embodiments may include an ear jack hole 109 disposed at one side of the interface connector port 107.

The electronic device 100 according to various embodiments may include a housing 110. The housing 110 according to various embodiments may be formed of a conductive member or a nonconductive member. The housing 110 may be disposed along a border of the electronic device 100, and may be disposed to extend to a portion of the front surface or to at least a portion of the rear surface.

The electronic device 100 according to various embodiments may include the housing 110 to serve as an exterior and to protect electronic components. The housing 110 according to various embodiments may include a first surface facing toward a first direction (①), a second surface facing toward a second direction (②) opposite the first direction (①), and a side surface facing toward a side direction perpendicular to the first and second directions (①, ②), and surrounding a space between the first and second surfaces at least in part.

According to various embodiments, when the first direction (①) faces upward, the first surface of the housing 110 may be an upper end of the housing, and, when the second direction (②) faces downward, the second surface may be a rear surface of the housing. For example, when the first direction (①) faces upward, the first surface of the housing 110 may be the front surface, and, when the second direction (②) faces downward, the second surface may be the rear surface.

The housing 110 according to various embodiments may include a plurality of side surfaces. For example, the side surfaces may include a side surface disposed on an upper edge of the housing 110, a side surface disposed on a lower edge of the housing 110, a side surface disposed on a left edge of the housing 110, or a side surface disposed on a right edge of the housing 110. All of the upper edge, the lower edge, the left edge, and the right edge may form the border or circumference of the electronic device 100.

The electronic device 100 according to various embodiments may include a rear surface window 111 disposed on a second surface 1002 (for example, the rear surface) opposite the first surface 1001. The electronic device 100 according to various embodiments may include a rear facing camera device 112 disposed through the rear surface window 111. According to various embodiments, the electronic device 100 may include at least one electronic component 113 disposed at one side of the rear facing camera device 112. According to various embodiments, the electronic component 113 may include at least one of an illuminance sensor (for example, an optical sensor), a proximity sensor (for example, an optical sensor), an infrared sensor, an ultrasonic sensor, a heartbeat sensor, a flash device, or a fingerprint recognition sensor.

The electronic device 100 according to various embodiments may include a battery pack (not shown) fixed to the housing 110 inside the electronic device 100, as a power supply means. The battery pack according to various embodiments may include a pouch type battery pack.

Figure 3:
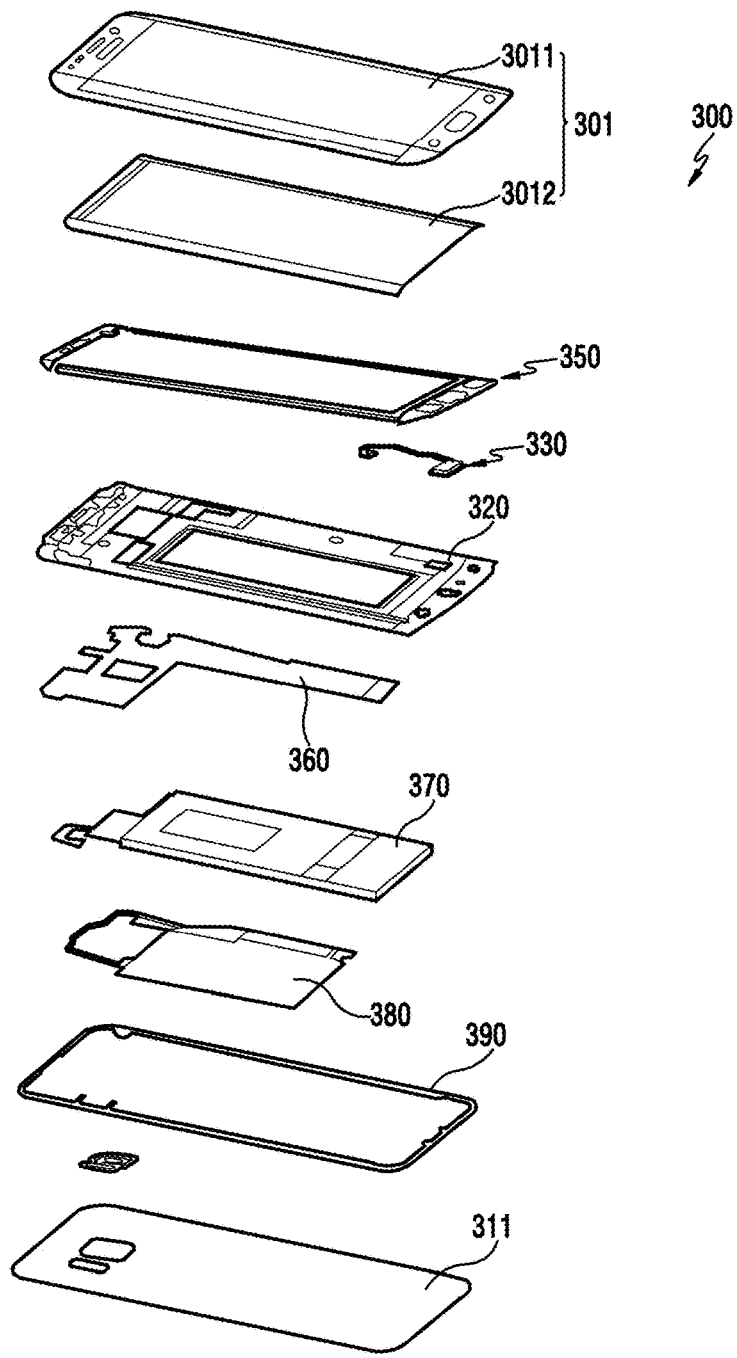
FIG. 3 is an exploded perspective view showing a configuration of an electronic device according to various embodiments.

FIG. 3 is an exploded perspective view illustrating an electronic device according to various embodiments of the present disclosure. The electronic device 300 of FIG. 3 may be similar to the electronic device 100 of FIGS. 1 and 2 or may include other embodiments of the electronic device.

Referring to FIG. 3, the electronic device 300 according to various embodiments may include a key input device 330, at least one seal member 350, and a display 310 including a display module 3012 and a transparent member 3011 (for example, a window), which are arranged in sequence above a housing 320. According to an exemplary embodiment of the present disclosure, the key input device 330 may be disposed in other positions or may be excluded according to a type of the electronic device, and is not limited to an element that is always needed. The electronic device 300 according to various embodiments may include a printed circuit board 360 (for example, a PCB, a FPC, or a main board), a battery pack 370, a wireless power transmission and reception member 380, a rear surface seal member 390, and a rear surface window 311, which are arranged in sequence under the housing 320. The battery pack 370 according to various embodiments may be received in a receiving space formed in the housing 320 for the battery pack 370, and may be disposed to avoid the printed circuit board 360. The battery pack 370 and the printed circuit board 360 according to various embodiments may be disposed in parallel to avoid overlapping each other. However, this should not be considered as limiting, and the battery pack 370 may be disposed to have at least a portion thereof overlap the printed circuit board 360.

In an exemplary embodiment of the present disclosure according to various embodiments, the housing 320 is independently used, but may be used along with at least one plate (for example, a middle plate, a rear plate, a removable battery cover, etc.) coupled to the housing 320. The housing 320 according to various embodiments may be formed by using a conductive member (for example, a metal member, etc.) and a nonconductive member (for example, resin, etc.) altogether. The housing 320 according to various embodiments may be formed of the conductive member and the nonconductive member by insert injection molding or double injection molding.

The display 301 according to various embodiments may be assembled with the housing 320 after attaching the display module 3012 to the rear surface of the transparent member 3011. The transparent member 3011 according to various embodiments may be formed of a transparent material such as glass or resin. The display module 3012 according to various embodiments may include a touch sensor. The display module 3012 according to various embodiments may include a touch sensor and a force sensor. The electronic device 300 according to various embodiments may include the at least one seal member 350 interposed between the housing 320 and the display 301 to perform a waterproof function.

The electronic device 300 according to various embodiments may include the rear surface seal member 390 disposed between the rear surface of the housing 320 and the rear surface window 311 along the border thereof to perform the waterproof function. The rear surface window 311 according to various embodiments may be formed of at least one material from among glass, plastic, compounded resin, or metal. The seal member 350 and rear surface seal member, 390 according to various embodiments may include at least one of a tape, an adhesive, waterproof dispensing, silicon, waterproof rubber, and urethane.

The printed circuit board 360 according to various embodiments may include a memory, a processor, various sensors, and input and output terminals, or the like, and may perform various functions of the electronic device by using power supplied from the battery pack 370. The printed circuit board 360 according to various embodiments may be disposed adjacent to the battery pack 370. The printed circuit board 360 according to various embodiments may be disposed in such a form as to overlap the battery pack 370 at least in part by bringing one surface of the printed circuit board 360 into contact with one surface of the battery pack 370, or may be formed in the shape of " ⌐ " or " ⌊ " to avoid a disposal space of the battery pack 370 and may be disposed to be coplanar with the battery pack 370.

The battery pack 370 according to various embodiments may supply power to main components such as the display 301, the printed circuit board 360, or the like, and may provide a seating plane for the wireless power transmission and reception member 380 or various sheet types of sensors. The battery pack 370 may be disposed in a battery pack mounting area guaranteeing a predetermined space with a seating cavity space or a guide rib, which is provided on a portion of the housing 320, to achieve stable assembly by the volume and weight of the battery pack 370, and to prevent a movement during use. The battery pack 370 according to various embodiments may be used a built-in battery pack built in the electronic device 300, or may be removed from the electronic device by opening a battery cover to be replaced.

The battery pack 370 according to various embodiments may include a battery pouch containing a battery cell, a protective circuit module (PCM) (for example, a circuit board) to which a terminal drawn out from the battery pouch is electrically connected, and a case (for example, a PCM housing or a PCM case) for protecting the PCM. The case containing the PCM according to various embodiments may be fixed to the battery pouch as an assembly structure for enhancing shock resistance, and accordingly, a breakdown of elements of the battery pack (for example, the battery pouch, the PCM, or the terminal) can be prevented even with external shock to the electronic device.

Figure 4:
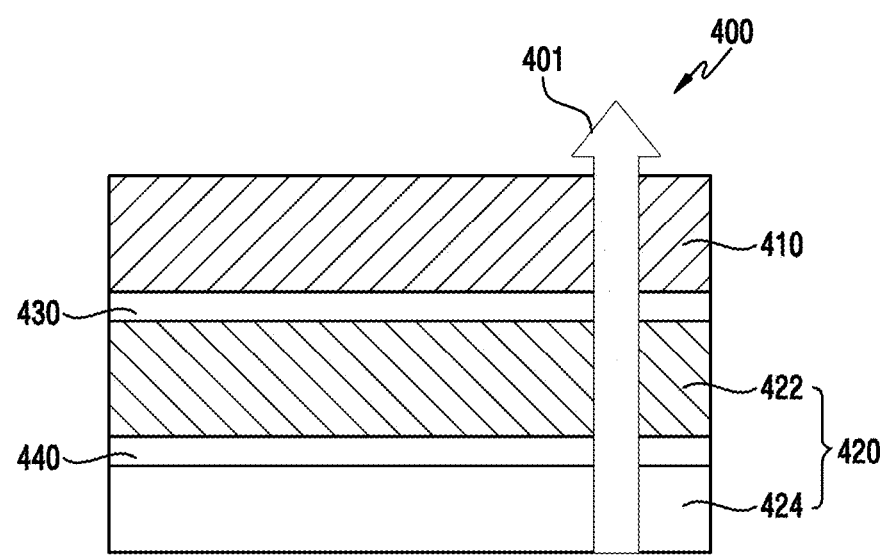
FIG. 4 is a cross-sectional view schematically showing a portion of a layered structure of a display mounted in a housing of an electronic device.

FIG. 4 is a cross-sectional view schematically showing a portion of a layered structure of a display mounted in a housing of an electronic device.

Referring to FIG. 4, an electronic device 400 may include a transparent member 410 (for example, 310 of FIG. 3) and a display panel 420 (for example, 320 of FIG. 3). The display panel 420 may be coupled to the transparent member 410 by a first adhesive member 430. For example, the first adhesive member 430 may be formed of a visually transparent material, and may be positioned between the transparent member 410 and the display panel 420 in the form of a layer.

The transparent member 410 may be formed of tempered glass, and may be disposed on the outermost portion of the electronic device 400. The transparent member 410 may be a window of a transparent material and may be disposed on the front surface of the electronic device 400.

The display panel 420 may include a polarizing film layer 422 and a light emitting layer 424. The polarizing film layer 422 may be disposed under the transparent member 410 in the form of a layer, and may be configured as an optical member to allow only a specific component of light emitting from the light emitting layer 424 to pass there through. For example, the display panel 420 may employ a liquid crystal diode (LCD) or an organic light emitting diode (OLED).

The light emitting layer 424 may include at least a portion of the OLED, for example, as a member emitting light. The light emitting layer 424 may be coupled to the polarizing film layer 422 by a second adhesive member 440. The second adhesive member 440 may be formed of the same material as that of the first adhesive member 430.

A thick arrow 401 indicates that light emitting from the light emitting layer 424 is guided to the outside, and indicates a quantity of transmitted light. Light emitting from the light emitting layer 424 may be guided to the outside through the polarizing film layer 422 and the transparent member 410.

However, in an electronic device 400, only about 43-44% of light emitting from the light emitting layer 424 may be transmitted and guided to the outside, while passing through the polarizing film layer 422 and the transparent member 410, and thus there is a problem that current consumption increases to enhance transmissivity of light.

Hereinafter, a structure for enhancing current consumption by enhancing transmissivity by applying a plurality of anti-reflection coating layers to a display panel structure of an electronic device will be described.

FIGS. 5 to 16 are cross-sectional views schematically showing a portion of a layered structure of a display employing an anti-reflection layer, which is mounted in a housing of an electronic device according to various embodiments of the present disclosure.

Figure 5:
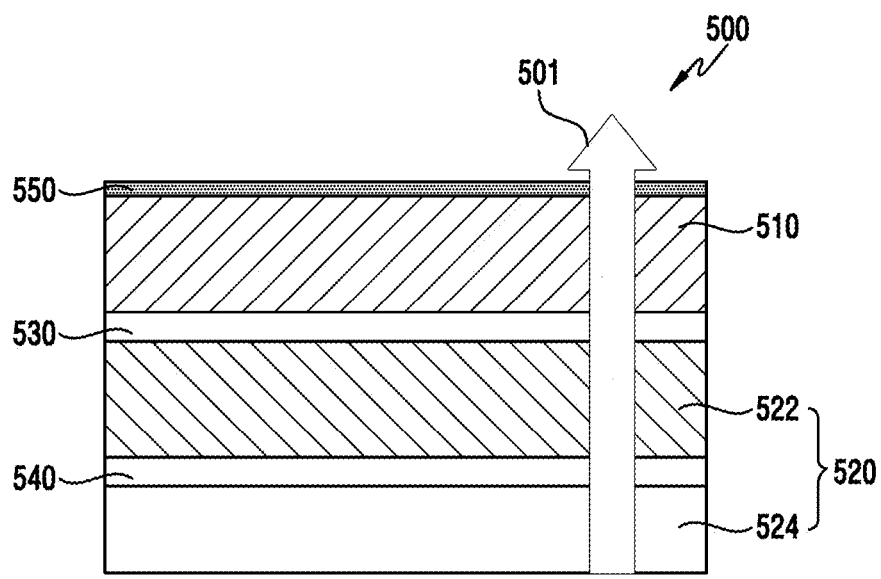
FIGS. 5 to 16 are cross-sectional views schematically showing a portion of a layered structure of a display employing one or more anti-reflection layers, which is mounted in a housing of an electronic device according to various embodiments of the present disclosure.

Referring to FIG. 5, the electronic device 500 according to various embodiments may include a transparent member 510, a display panel 520, and an anti-reflection layer 550. For example, the transparent member 510 may be a portion of a transparent window disposed on a front surface region of the electronic device 500. In addition, the transparent member 510 may be disposed in at least a portion of the housing (see FIGS. 1 to 3) configuring the electronic device 500.

The display panel 520 according to various embodiments may be housed in at least a portion of the housing of the electronic device 500, and may be coupled to at least a portion of the transparent member 510. The display panel 520 may be coupled to the transparent member 510 by a first adhesive member 530. In addition, the display panel 520 may be formed in a flat shape or in a curved shape (see FIG. 16). For example, the display panel 520 may employ an LCD, an OLED, or the like. The first adhesive member 530 may be formed of a visually transparent material, and may be positioned between the transparent member 510 and the display panel 520 in the form of a layer.

The display panel 520 according to various embodiments may be formed of any one material of a rigid material or a flexible material. In addition, the display panel 520 may be formed in a flat shape or in a curved shape (see FIG. 16).

The transparent member 510 according to various embodiments may include a first surface facing toward a first direction and a second surface facing toward a second direction opposite the first direction. The first surface may be an upper surface of the transparent member 510, and the second surface may be a lower surface of the transparent member 510. The anti-reflection layer 550 may belong to at least a portion of the transparent window positioned on the front surface region of the electronic device 500. For example, the transparent member 510 may be referred to as a transparent board, a transparent window, a window, a front surface window, a front surface cover, a front surface cover window, a transparent plate, or the like. The transparent member 510 according to various embodiments may be formed of glass or synthetic resin of a transparent material, and may be disposed on the outermost portion of the electronic device 500. The transparent member 510 may be disposed on the front surface of the electronic device 500 as a window of a transparent material.

The anti-reflection layer 550 according to various embodiments may be disposed on the first surface of the transparent member 510. The anti-reflection layer 550 may be disposed on the outermost portion of the electronic device 500, and may be disposed on at least a portion of the front surface region of the electronic device 500. For example, the anti-reflection layer 550 may be disposed on the upper surface of the transparent member 510 by a deposition process, for example, a sputtering process.

The display panel 520 according to various embodiments may include a polarizing film layer 522 and a light emitting layer 524. The polarizing film layer 522 may include a first surface facing toward the first direction and a second surface facing toward the second direction opposite the first direction. The first surface may be an upper surface of the polarizing film layer 522, and the second surface may be a lower surface of the polarizing film layer 522. The polarizing film layer 522 may be disposed under the transparent member 510 in the form of a layer, and may be configured as an optical member to allow only a specific component of light emitting from the light emitting layer 524 to pass therethrough.

The light emitting layer 524 according to various embodiments may include at least a portion of an OLED, for example, as a member emitting light. The light emitting layer 524 may be coupled to the polarizing film layer 522 by a second adhesive member 540. The second adhesive member 540 may be formed of the same material as that of the first adhesive member 530.

The transparent member 510 according to various embodiments may be disposed between the anti-reflection layer 550 and the polarizing film layer 522, and may be disposed between the anti-reflection layer 550 and the first adhesive member 530.

A thick arrow 501 indicates that light emitting from the light emitting layer 524 is guided to the outside, and indicates a quantity of transmitted light. Light emitting from the light emitting layer 524 may be guided to the outside through the polarizing film layer 522, the transparent member 510, and the anti-reflection layer 550.

In the electronic device 500 formed of such a layered structure, about 46-46.5% of light emitting from the light emitting layer 524 may be transmitted and guided to the outside, while passing through the polarizing film layer 522, the transparent member 510, and the anti-reflection layer 550.

Figure 6:
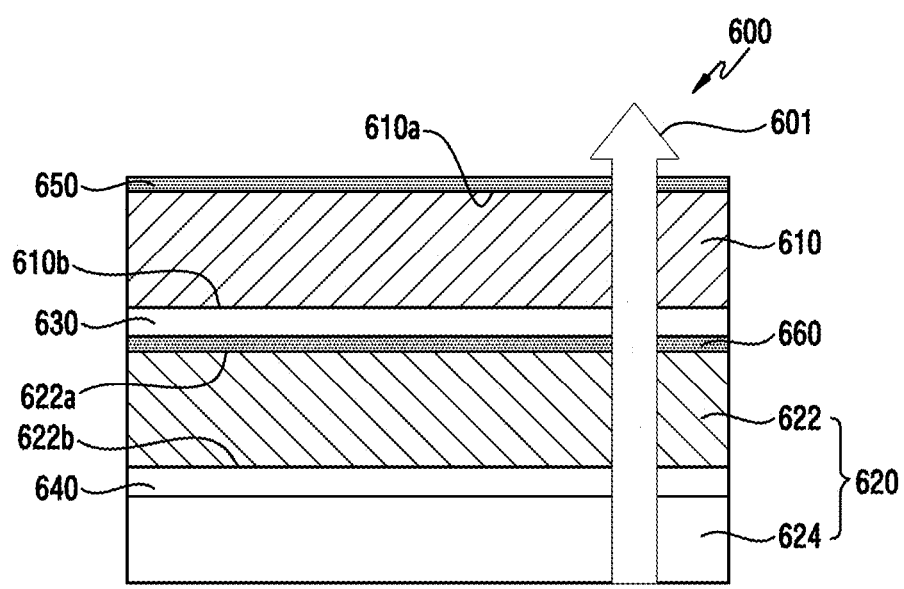

FIG. 6 is a cross-sectional view schematically showing a portion of a layered structure of a display employing a plurality of anti-reflection layers (for example, first and second anti-reflection layers), which is mounted in a housing of an electronic device according to various embodiments of the present disclosure.

Referring to FIG. 6, the electronic device 600 according to various embodiments may include a transparent member 610, a display panel 620, and first and second anti-reflection layers 650, 660. For example, the transparent member 610 may be a portion of a transparent window disposed on a front surface region of the electronic device 600. In addition, the transparent member 610 may be disposed in at least a portion of the housing (see FIGS. 1 to 3) configuring the electronic device 600.

The display panel 620 according to various embodiments may be housed in at least a portion of the housing of the electronic device 600, and may be coupled to at least a portion of the transparent member 610. The display panel 620 may be coupled to the transparent member 610 by a first adhesive member 630. For example, the first adhesive member 630 may be formed of a visually transparent material, and may be positioned between the transparent member 610 and the display panel 620 in the form of a layer.

The display panel 620 according to various embodiments may be formed of any one material of a rigid material or a flexible material. In addition, the display panel 620 may be formed in a flat shape or in a curved shape (see FIG. 16).

The transparent member 610 according to various embodiments may include a first surface 610a facing toward a first direction and a second surface 610b facing toward a second direction opposite the first direction. The first surface 610a may be an upper surface of the transparent member 610, and the second surface 610b may be a lower surface of the transparent member 610. The first anti-reflection layer 650 may belong to at least a portion of the transparent window positioned on the front surface region of the electronic device 600. In addition, the display panel 620 may be formed in a flat shape or in a curved shape (see FIG. 16). For example, the transparent member 610 may be referred to as a transparent board, a transparent window, a window, a front surface window, a front surface cover, a front surface cover window, a transparent plate, or the like.

The transparent member 610 according to various embodiments may be formed of glass or synthetic resin of a transparent material, and may be disposed on the outermost portion of the electronic device 600. The transparent member 610 may be disposed on most of the front surface or a portion of the front surface of the electronic device 600 as a window of a transparent material.

The first anti-reflection layer 650 according to various embodiments may be disposed on the first surface 610a of the transparent member 610. The first anti-reflection layer 650 may be disposed on the outermost portion of the electronic device 600, and may be disposed on at least a portion of the front surface region of the electronic device 600. For example, the first anti-reflection layer 650 may be disposed on the upper surface of the transparent member 610 by a deposition process, for example, a sputtering process.

The second anti-reflection layer 660 according to various embodiments may be disposed on a first surface 622a of a polarizing film layer 622. The second anti-reflection layer 660 may be disposed inside the electronic device 600, and may be disposed on at least a portion of the display panel of the electronic device 600. For example, the second anti-reflection layer 660 may be disposed on an upper surface of the polarizing film layer 622 by a deposition process, for example, a sputtering process.

The display panel 620 according to various embodiments may include the polarizing film layer 622 and a light emitting layer 624. The polarizing film layer 622 may include the first surface 622a facing toward the first direction and a second surface 622b facing toward the second direction opposite the first direction. The first surface 622a may be an upper surface of the polarizing film layer 622, and the second surface 622b may be a lower surface of the polarizing film layer 622. The polarizing film layer 622 may be disposed under the transparent member 610 in the form of a layer, and may be configured as an optical member to allow only a specific component of light emitting from the light emitting layer 624 to pass therethrough.

The light emitting layer 624 according to various embodiments may include at least a portion of an OLED, for example, as a member emitting light. The light emitting layer 624 may be coupled to the second surface 622b of the polarizing film layer 622 by a second adhesive member 640. The second adhesive member 640 may be formed of the same material as that of the first adhesive member 630.

The transparent member 610 according to various embodiments may be disposed between the first anti-reflection layer 650 and the polarizing film layer 622, may be disposed between the first anti-reflection layer 650 and the first adhesive member 630, and may be disposed between the first and second anti-reflection layer 650, 660.

A thick arrow 601 indicates that light emitting from the light emitting layer 624 is guided to the outside, and indicates a quantity of transmitted light. Light emitting from the light emitting layer 624 may be guided to the outside through the polarizing film layer 622, the second anti-reflection layer 660, the transparent member 610, and the first anti-reflection layer 650.

In the electronic device 600 formed of such a layered structure, about 45-46% of light emitting from the light emitting layer 624 may be transmitted and guided to the outside, while passing through the polarizing film layer 622, the second anti-reflection layer 660, the transparent member 610, and the first anti-reflection layer 650.

Figure 7:
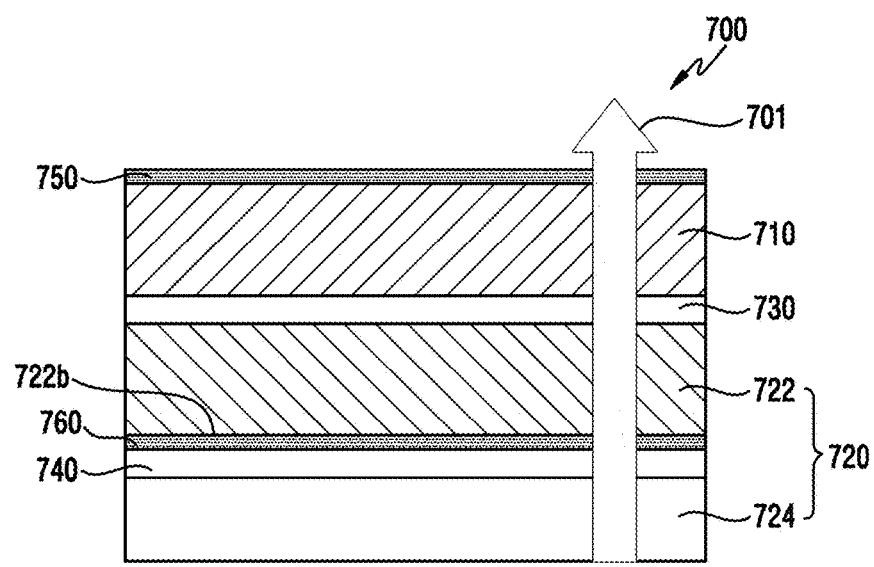

FIG. 7 is a cross-sectional view schematically showing a portion of a layered structure of a display employing first and second anti-reflection layers (for example, 750, 760), which is mounted in a housing of an electronic device according to various embodiments of the present disclosure.

Compared with the electronic device 600 shown in FIG. 6, the electronic device 700 according to various embodiments shown in FIG. 7 differs from the electronic device 600 only in the disposal position of the second anti-reflection layer 760, and the other elements are the same as those of FIG. 6. Therefore, a redundant explanation is omitted. The second anti-reflection layer 760 shown in FIG. 7 may be disposed on a second surface 722b of a polarizing film layer 722, whereas the second anti-reflection layer 660 shown in FIG. 6 is disposed on the first surface 622a of the polarizing film layer 622.

The second anti-reflection layer 760 according to various embodiments may be disposed on the second surface 722b of the polarizing film layer, but may be disposed between the polarizing film layer 722 and a second adhesive member 740 and may be disposed between the polarizing film layer 722 and a light emitting layer 724. In addition, a transparent member 710, a first adhesive member 730, and the polarizing film layer 722 may be disposed in sequence between the first and second anti-reflection layers 750, 760.

In the electronic device 700 formed of such a layered structure, about 48-48.5% of light emitting from the light emitting layer 724 may be transmitted and guided to the outside, while passing through the second anti-reflection layer 760, the polarizing film layer 722, the transparent member 710, and the first anti-reflection layer 750.

The transparent member 710 according to various embodiments may be disposed between the first anti-reflection layer 750 and the polarizing film layer 722, may be disposed between the first anti-reflection layer 750 and the first adhesive member 730, and may be disposed between the first and second anti-reflection layer 750, 760.

A thick arrow 701 indicates that light emitting from the light emitting layer 724 is guided to the outside, and indicates a quantity of transmitted light.

Compared with the electronic device 400 having the layered structure of the display panel shown in FIG. 4, the electronic device 700 having the layered structure of the display panel shown in FIG. 7 is enhanced by about 5% when brightness of the display panel is measured, and current consumption of the display panel is enhanced by about 10%. In addition, battery consumption of the electronic device is enhanced by about 1%.

Figure 8:
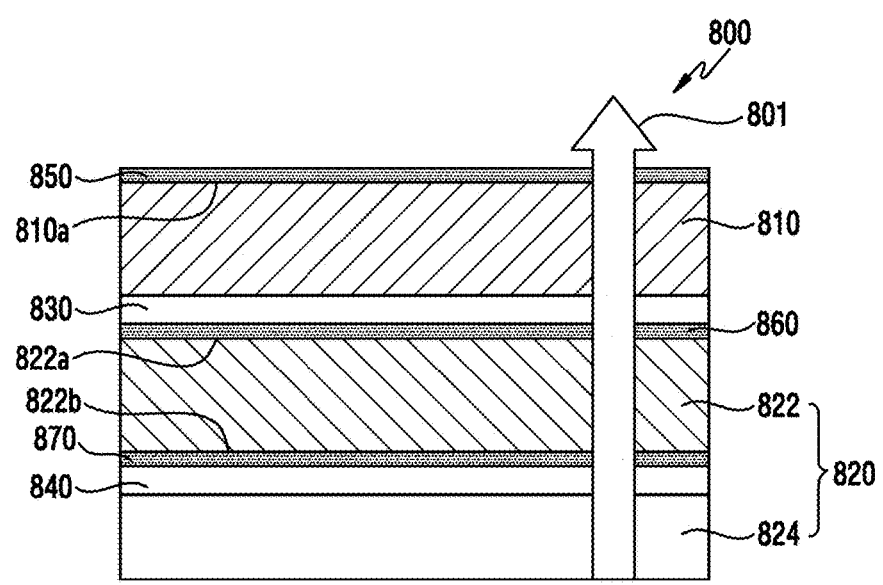

FIG. 8 is a cross-sectional view schematically showing a portion of a layered structure of a display employing first, second, and third anti-reflection layers (for example, 850, 860, 870), which is mounted in a housing of an electronic device according to various embodiments of the present disclosure.

Referring to FIG. 8, the electronic device 800 according to various embodiments may include a transparent member 810, a display panel 820, and first, second, and third anti-reflection layers 850, 860, 870. For example, the transparent member 810 may be a portion of a transparent window disposed on a front surface region of the electronic device 800. In addition, the transparent member 810 may be disposed in at least a portion of the housing (see FIGS. 1 to 3) configuring the electronic device 800.

The display panel 820 according to various embodiments may be housed in at least a portion of the housing of the electronic device 800, and may be coupled to at least a portion of the transparent member 810. The display panel 820 may be coupled to the transparent member 810 by a first adhesive member 830. For example, the first adhesive member 830 may be formed of a visually transparent material, and may be positioned between the transparent member 810 and the display panel 820 in the form of a layer.

The display panel 820 according to various embodiments may be formed with the same material characteristic as that of the display panel 720 shown in FIG. 7. In addition, the display panel 820 may be formed in a flat shape or in a curved shape (see FIG. 16).

The transparent member 810 according to various embodiments may include a first surface facing toward a first direction and a second surface facing toward a second direction opposite the first direction. The first surface may be an upper surface of the transparent member 810, and the second surface may be a lower surface of the transparent member 810. The first anti-reflection layer 850 may belong to at least a portion of the transparent window positioned on the front surface region of the electronic device 800. The second and third anti-reflection layers 860, 870 may belong to a portion of the display panel 820 of the electronic device.

Figure 16:
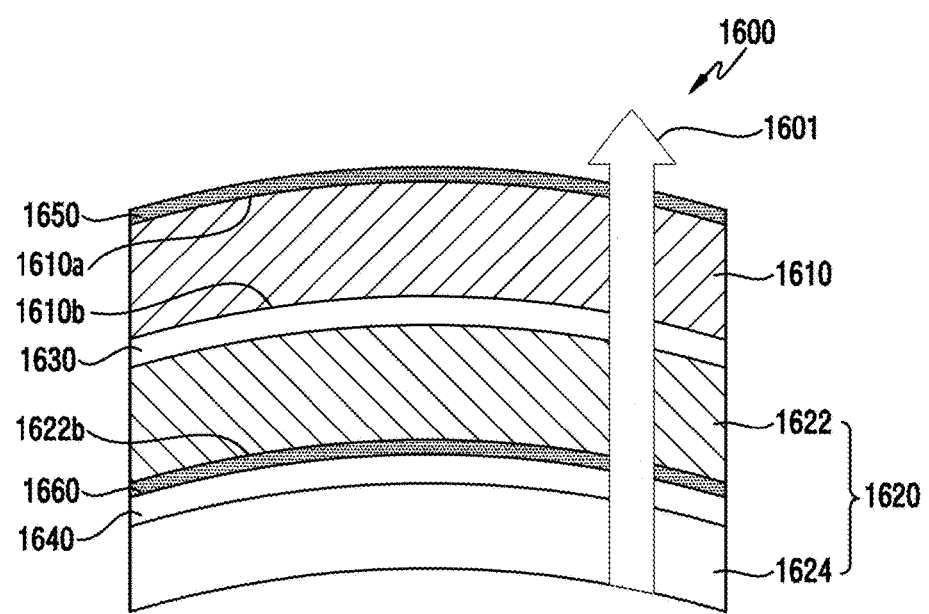

In addition, the display panel 820 may be formed in a flat shape or in a curved shape (see FIG. 16). For example, the transparent member 810 may be referred to as a transparent board, a transparent window, a window, a front surface window, a front surface cover, a front surface cover window, a transparent plate, or the like.

The transparent member 810 according to various embodiments may be formed of glass or synthetic resin of a transparent material, and may be disposed on the outermost portion of the electronic device 800. The transparent member 810 may be disposed on most of the front surface or a portion of the front surface of the electronic device 800 as a window of a transparent material.

The first anti-reflection layer 850 according to various embodiments may be disposed on the first surface 810a of the transparent member 810. The first anti-reflection layer 850 may be disposed on the outermost portion of the electronic device 800, and may be disposed on at least a portion of the front surface region of the electronic device 800. For example, the first anti-reflection layer 850 may be disposed on the upper surface of the transparent member 810 by a deposition process, for example, a sputtering process.

The second anti-reflection layer 860 according to various embodiments may be disposed on a first surface 822a of a polarizing film layer 822. The second anti-reflection layer 860 may be disposed inside the electronic device 800, and may be disposed on at least a portion of the display panel of the electronic device 800. For example, the second anti-reflection layer 860 may be disposed on an upper surface of the polarizing film layer 822 by a deposition process, for example, a sputtering process.

The third anti-reflection layer 870 according to various embodiments may be disposed on a second surface 822b of the polarizing film layer 822. The third anti-reflection layer 870 may be disposed inside the electronic device 800, and may be disposed on at least a portion of the display panel of the electronic device 800. For example, the third anti-reflection layer 870 may be disposed on a lower surface of the polarizing film layer 822 by a deposition process, for example, a sputtering process.

The display panel 820 according to various embodiments may include the polarizing film layer 822 and a light emitting layer 824. The polarizing film layer 822 may include the first surface 822a facing toward the first direction and the second surface 822b facing toward the second direction opposite the first direction. The first surface 822a may be an upper surface of the polarizing film layer 822, and the second surface 822b may be a lower surface of the polarizing film layer 822. The polarizing film layer 822 may be disposed under the transparent member 810 in the form of a layer, and may be configured as an optical member to allow only a specific component of light emitting from the light emitting layer 824 to pass therethrough.

The light emitting layer 824 according to various embodiments may include at least a portion of an OLED, for example, as a member emitting light. The light emitting layer 824 may be coupled to the second surface (third anti-reflection layer) of the polarizing film layer 822 by a second adhesive member 840. The second adhesive member 840 may be formed of the same material as that of the first adhesive member 830.

The transparent member 810 according to various embodiments may be disposed between the first anti-reflection layer 850 and the polarizing film layer 822, may be disposed between the first anti-reflection layer 850 and the first adhesive member 830, and may be disposed between the first and second anti-reflection layer 850, 860.

A thick arrow 801 indicates that light emitting from the light emitting layer 824 is guided to the outside, and indicates a quantity of transmitted light. Light emitting from the light emitting layer 824 may be guided to the outside through the third anti-reflection layer 870, the polarizing film layer 822, the second anti-reflection layer 860, the transparent member 810, and the first anti-reflection layer 850, and about 47-47.5% of the light may be transmitted and guided to the outside.

Figure 9:
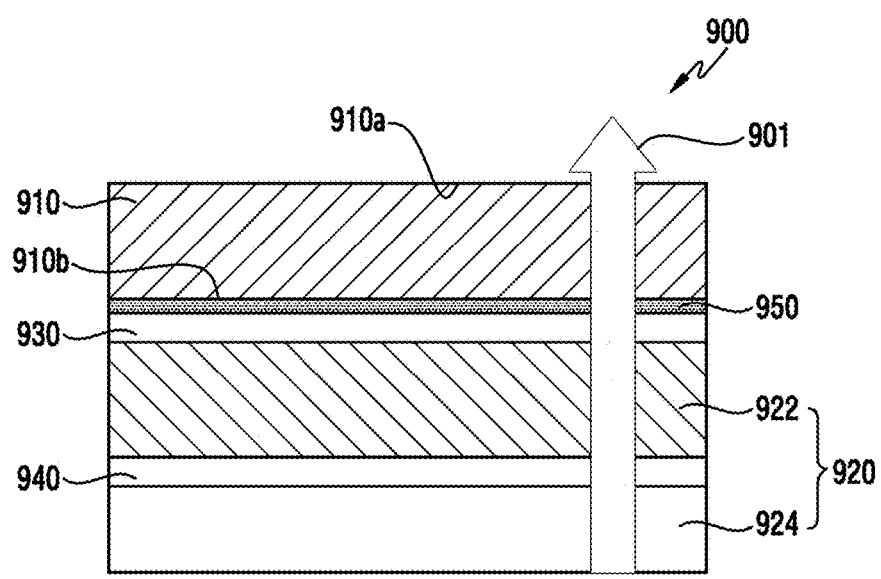

FIG. 9 is a cross-sectional view schematically showing a portion of a layered structure of a display employing an anti-reflection layer (for example, 950), which is mounted in a housing of an electronic device according to various embodiments of the present disclosure.

Referring to FIG. 9, the electronic device 900 according to various embodiments may include a transparent member 910, a display panel 920, and an anti-reflection layer 950. For example, the transparent member 910 may be a portion of a transparent window disposed on a front surface region of the electronic device 900. In addition, the transparent member 910 may be disposed in at least a portion of the housing (see FIGS. 1 to 3) configuring the electronic device 900.

The display panel 920 according to various embodiments may be housed in at least a portion of the housing of the electronic device 900, and may be coupled to at least a portion of the transparent member 910. The display panel 920 may be coupled to the transparent member 910 by a first adhesive member 930. In addition, the display panel 920 may be formed in a flat shape or in a curved shape (see FIG. 16). For example, the display panel 920 may employ an LCD, an OLED, or the like. The first adhesive member 930 may be formed of a visually transparent material, and may be positioned between the transparent member 910 and the display panel 920 in the form of a layer.

The display panel 920 according to various embodiments may be formed to have the same characteristic as that of the material illustrated in FIG. 8. In addition, the display panel 920 may be formed in a flat shape or in a curved shape (see FIG. 16).

The transparent member 910 according to various embodiments may include a first surface 910a facing toward a first direction and a second surface 910b facing toward a second direction opposite the first direction. The first surface 910a may be an upper surface of the transparent member 910, and the second surface 910b may be a lower surface of the transparent member 910. The anti-reflection layer 950 may belong to at least a portion of the transparent window positioned on the front surface region of the electronic device 900. For example, the transparent member 910 may be referred to as a transparent board, a transparent window, a window, a front surface window, a front surface cover, a front surface cover window, a transparent plate, or the like. The transparent member 910 according to various embodiments may be formed of glass or synthetic resin of a transparent material, and may be disposed on the outermost portion of the electronic device 900. The transparent member 910 may be disposed on the front surface of the electronic device 900 as a window of a transparent material.

The anti-reflection layer 950 according to various embodiments may be disposed on the second surface 910b of the transparent member 910. The anti-reflection layer 950 may be disposed on at least a portion of the front surface region of the electronic device 900. For example, the anti-reflection layer 950 may be disposed on the upper surface of the transparent member 910 by a deposition process, for example, a sputtering process.

The display panel 920 according to various embodiments may include a polarizing film layer 922 and a light emitting layer 924. The polarizing film layer 922 may include a first surface facing toward the first direction and a second surface facing toward the second direction opposite the first direction. The first surface may be an upper surface of the polarizing film layer 922, and the second surface may be a lower surface of the polarizing film layer 922. The polarizing film layer 922 may be disposed under the transparent member 910 in the form of a layer, and may be configured as an optical member to allow only a specific component of light emitting from the light emitting layer 924 to pass therethrough.

The light emitting layer 924 according to various embodiments may include at least a portion of an OLED, for example, as a member emitting light. The light emitting layer 924 may be coupled to the polarizing film layer 922 by a second adhesive member 940. The second adhesive member 940 may be formed of the same material as that of the first adhesive member 930.

A thick arrow 901 indicates that light emitting from the light emitting layer 924 is guided to the outside, and indicates a quantity of transmitted light. Light emitting from the light emitting layer 924 may be guided to the outside through the polarizing film layer 922, the anti-reflection layer 950, and the transparent member 910, and about 45.3-46% of the light may be transmitted and guided to the outside.

Figure 10:
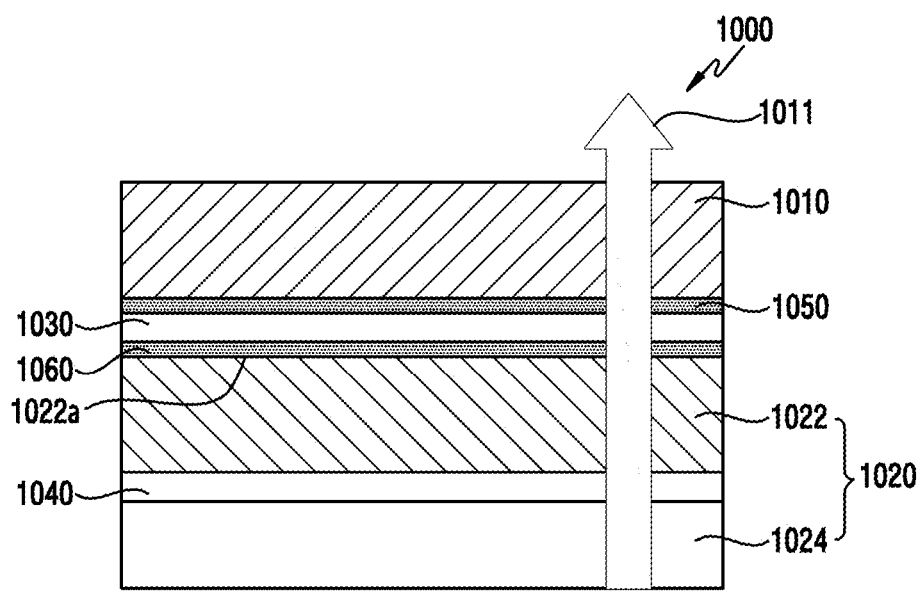

FIG. 10 is a cross-sectional view schematically showing a portion of a layered structure of a display employing a plurality of anti-reflection layers (for example, first and second anti-reflection layers), which is mounted in a housing of an electronic device according to various embodiments of the present disclosure.

Compared with the electronic device 900 shown in FIG. 9, the electronic device 1000 according to various embodiments shown in FIG. 10 differs from the electronic device 900 only in the addition of a second anti-reflection layer 1060, and the other elements are the same as those of FIG. 9. Therefore, a redundant explanation is omitted. The second anti-reflection layer 1060 shown in FIG. 10 may be disposed on a first surface 1022a of a polarizing film layer 1022.

The second anti-reflection layer 1060 according to various embodiments may be disposed on the first surface 1022a of the polarizing film layer, but may be disposed between the polarizing film layer 1022 and a first adhesive member 1030 and may be disposed between the polarizing film layer 1022 and a first anti-reflection layer 1050. In addition, the first adhesive member 1030 may be disposed between the first and second anti-reflection layer 1050, 1060.

A thick arrow 1011 indicates that light emitting from a light emitting layer 1024 is guided to the outside, and indicates a quantity of transmitted light. Light emitting from the light emitting layer 1024 may be guided to the outside through the polarizing film layer 1022, the second anti-reflection layer 1060, the first anti-reflection layer 1050, and the transparent member 1010, and about 43-44% of the light may be transmitted and guided to the outside.

Figure 11:
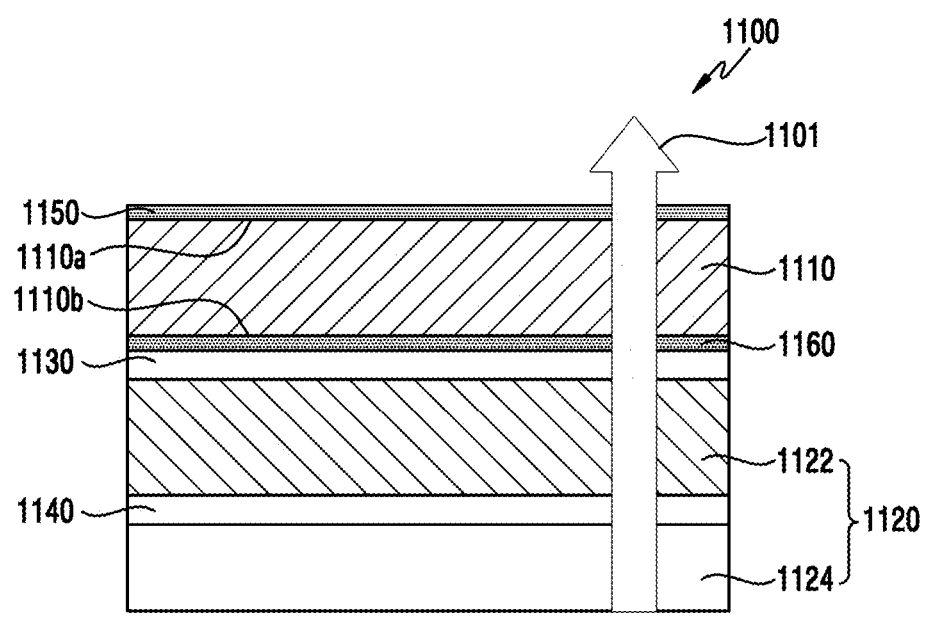

FIG. 11 is a cross-sectional view schematically showing a portion of a layered structure of a display employing a plurality of anti-reflection layers (for example, first and second anti-reflection layers), which is mounted in a housing of an electronic device according to various embodiments of the present disclosure.

Compared with the electronic device 900 shown in FIG. 9, the electronic device 1100 according to various embodiments shown in FIG. 11 differs from the electronic device 900 only in the addition of a first anti-reflection layer 1150, and the other elements are the same as those of FIG. 9.

Therefore, a redundant explanation is omitted. The first anti-reflection layer 1150 shown in FIG. 11 may be disposed on a first surface 1110a of a transparent member 1110.

The electronic device 1100 according to various embodiments may have the first anti-reflection layer 1150 disposed on the first surface 1110a of the transparent member 1110, and may have a second anti-reflection layer 1160 disposed on a second surface 1110b of the transparent member 1110. The transparent member 1110 may be disposed between the first and second anti-reflection layers 1150, 1160 according to various embodiments.

A thick arrow 1101 indicates a quantity of light transmitted and guided to the outside after emitting from a light emitting layer 1124. Light emitting from the light emitting layer 1124 may be guided to the outside through a polarizing film layer 1122, the second anti-reflection layer 1160, the transparent member 1110, and the first anti-reflection layer 1150, and about 45-45.5% of the light may be transmitted and guided to the outside.

Figure 12:
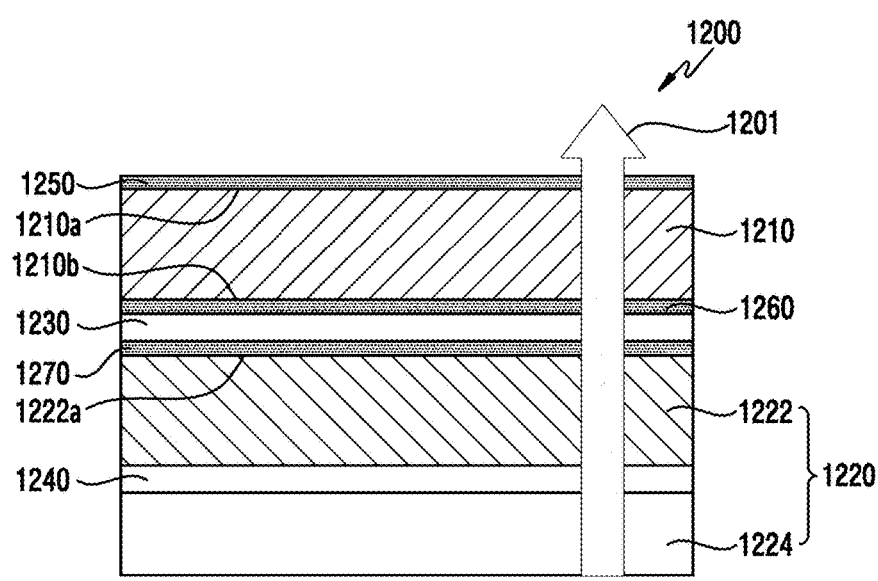

FIG. 12 is a cross-sectional view schematically showing a portion of a layered structure of a display employing a plurality of anti-reflection layers (for example, first, second, and third anti-reflection layers), which is mounted in a housing of an electronic device according to various embodiments of the present disclosure.

Compared with the electronic device 1100 shown in FIG. 11, the electronic device 1200 according to various embodiments shown in FIG. 12 differs from the electronic device 1100 only in the addition of a third anti-reflection layer 1270, and the other elements are the same as those of FIG. 11. Therefore, a redundant explanation is omitted. The third anti-reflection layer 1270 shown in FIG. 12 may be disposed on a first surface 1222a of a polarizing film layer 1222.

The electronic device 1200 according to various embodiments may have a first anti-reflection layer 1250 disposed on a first surface 1210a of a transparent member 1210, may have a second anti-reflection layer 1260 disposed on a second surface 1210b of the transparent member 1210, and may have the third anti-reflection layer 1270 disposed on the first surface 1222a of the polarizing film layer 1222. The transparent member 1210 may be disposed between the first and second anti-reflection layers 1250, 1260 according to various embodiments, a first adhesive member 1230 may be disposed between the second and third anti-reflection layers 1260, 1270, and the polarizing film layer 1222 may be disposed between the third anti-reflection layer 1270 and a second adhesive member 1240.

A thick arrow 1201 indicates a quantity of light transmitted and guided to the outside after emitting from a light emitting layer 1224. Light emitting from the light emitting layer 1224 may be guided to the outside through the polarizing film layer 1222, the third anti-reflection layer 1270, the second anti-reflection layer 1260, the transparent member 1210, and the first anti-reflection layer 1250, and about 45-45.5% of the light may be transmitted and guided to the outside.

Figure 13:
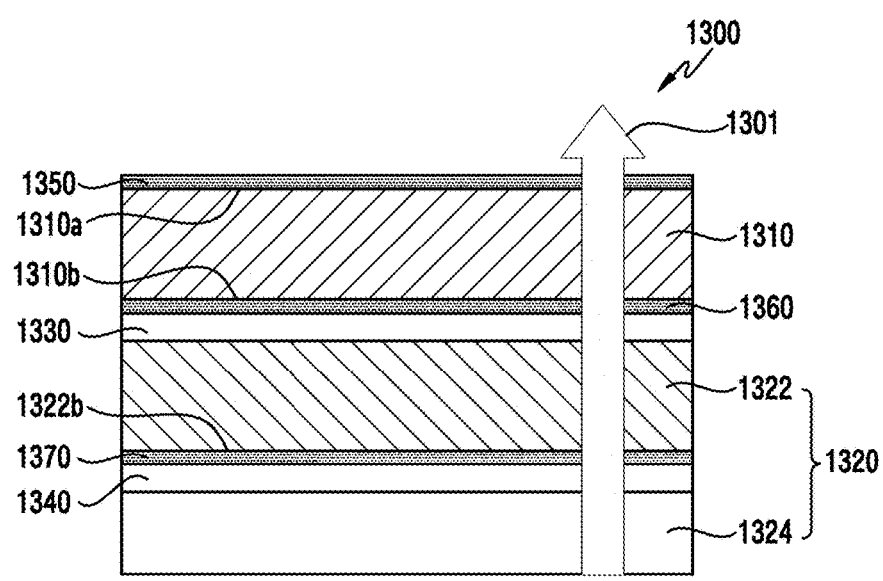

FIG. 13 is a cross-sectional view schematically showing a portion of a layered structure of a display employing a plurality of anti-reflection layers (for example, first, second, and third anti-reflection layers), which is mounted in a housing of an electronic device according to various embodiments of the present disclosure.

Compared with the electronic device 1100 shown in FIG. 11, the electronic device 1300 according to various embodiments shown in FIG. 13 differs from the electronic device 1100 only in the addition of a third anti-reflection layer 1370, and the other elements are the same as those of FIG. 11. Therefore, a redundant explanation is omitted. The third anti-reflection layer 1370 shown in FIG. 13 may be disposed on a second surface 1322b of a polarizing film layer 1322.

The electronic device 1300 according to various embodiments may have a first anti-reflection layer 1350 disposed on a first surface 1310a of a transparent member 1310, may have a second anti-reflection layer 1360 disposed on a second surface 1310b of the transparent member 1310, and may have the third anti-reflection layer 1370 disposed on the second surface 1322b of the polarizing film layer 1322. The transparent member 1310 may be disposed between the first and second anti-reflection layers 1350, 1360 according to various embodiments, and the polarizing film layer 1322 and a first adhesive member 1330 may be disposed between the second and third anti-reflection layers 1360, 1370.

A thick arrow 1301 indicates a quantity of light transmitted and guided to the outside after emitting from a light emitting layer 1324. Light emitting from the light emitting layer 1324 may be guided to the outside through the third anti-reflection layer 1370, the polarizing film layer 1322, the second anti-reflection layer 1360, the transparent member 1310, and the first anti-reflection layer 1350, and about 47-47.5% of the light may be transmitted and guided to the outside.

Figure 14:
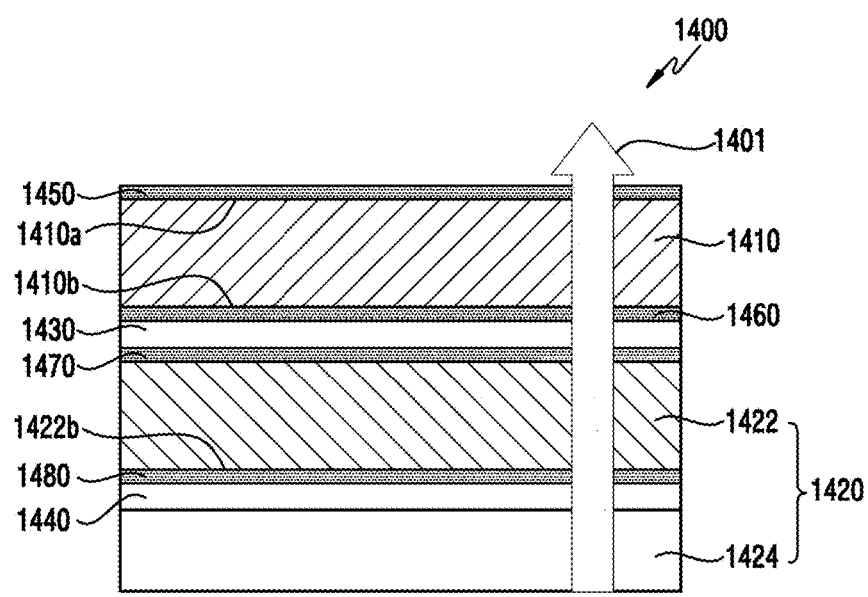

FIG. 14 is a cross-sectional view schematically showing a portion of a layered structure of a display employing a plurality of anti-reflection layers (for example, first, second, third, and fourth anti-reflection layers), which is mounted in a housing of an electronic device according to various embodiments of the present disclosure.

Compared with the electronic device 1200 shown in FIG. 12, the electronic device 1400 according to various embodiments shown in FIG. 14 differs from the electronic device 1200 only in the addition of a fourth anti-reflection layer 1480, and the other elements are the same as those of FIG. 12. Therefore, a redundant explanation is omitted. The fourth anti-reflection layer 1480 shown in FIG. 14 may be disposed on a second surface 1422b of a polarizing film layer 1422.

The electronic device 1400 according to various embodiments may have a first anti-reflection layer 1450 disposed on a first surface 1410a of a transparent member 1410, may have a second anti-reflection layer 1460 disposed on a second surface 1410b of the transparent member 1410, may have a third anti-reflection layer 1470 disposed on a first surface 1422a of the polarizing film layer 1422, and may have the fourth anti-reflection layer 1480 disposed on the second surface 1422b of the polarizing film layer 1422. The transparent member 1410 may be disposed between the first and second anti-reflection layers 1450, 1460 according to various embodiments, a first adhesive member 1430 may be disposed between the second and third anti-reflection layers 1460, 1470, and the polarizing film layer 1422 may be disposed between the third and fourth anti-reflection layers 1470, 1480.

A thick arrow 1401 indicates a quantity of light transmitted and guided to the outside after emitting from a light emitting layer 1424. Light emitting from the light emitting layer 1424 may be guided to the outside through the fourth anti-reflection layer 1480, the polarizing film layer 1422, the third anti-reflection layer 1470, the second anti-reflection layer 1460, the transparent member 1410, and the first anti-reflection layer 1450, and about 47-47.5% of the light may be transmitted and guided to the outside.

Figure 15:
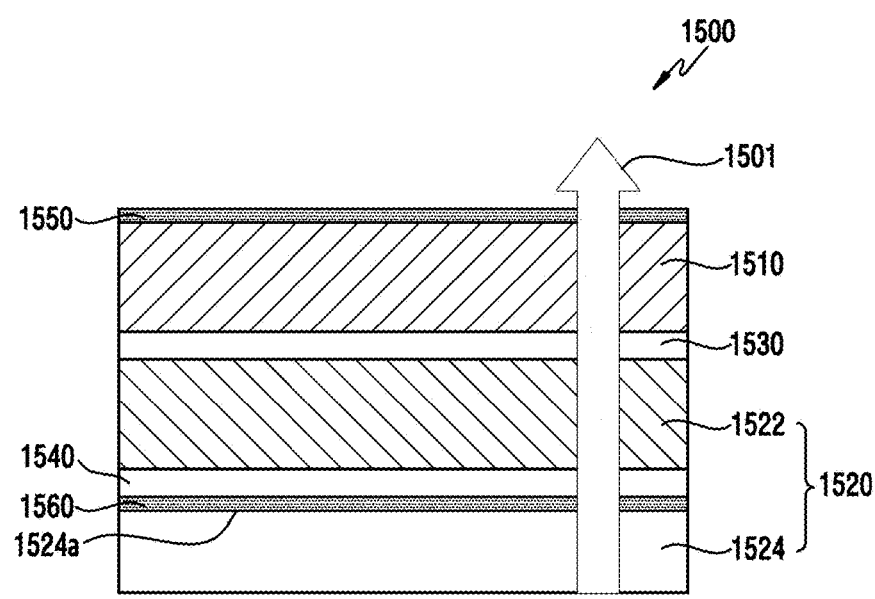

FIG. 15 is a cross-sectional view schematically showing a portion of a layered structure of a display employing a plurality of anti-reflection layers (for example, first and second anti-reflection layers), which is mounted in a housing of an electronic device according to various embodiments of the present disclosure.

Compared with the electronic device 500 shown in FIG. 5, the electronic device 1500 according to various embodiments shown in FIG. 15 differs from the electronic device 500 only in the addition of a second anti-reflection layer 1560, and the other elements are the same as those of FIG. 5. Therefore, a redundant explanation is omitted. The second anti-reflection layer 1560 shown in FIG. 15 may be disposed on a first surface 1524a of a light emitting layer 1524.

The second anti-reflection layer 1560 according to various embodiments may be disposed on the first surface 1524a of the light emitting layer 1524, but may be disposed under a second adhesive member 1540.

In the electronic device 1500 formed of such a layered structure, about 48-48.5% of light emitting from the light emitting layer 1524 may be transmitted and guided to the outside, while passing through the second anti-reflection layer 1560, a polarizing film layer 1522, a transparent member 1510, and a first anti-reflection layer 1550.

A thick arrow 1501 indicates that light emitting from the light emitting layer 1524 is guided to the outside, and indicates a quantity of transmitted light. Light emitting from the light emitting layer 1524 may be guided to the outside by passing through the second anti-reflection layer 1560, the polarizing film layer 1522, the transparent member 1510, and the first anti-reflection layer 1550 in sequence.

FIG. 16 is a cross-sectional view schematically showing a portion of a layered structure of a display employing first and second anti-reflection layers 1650, 1660, which is mounted in a housing of an electronic device according to various embodiments of the present disclosure.

Referring to FIG. 16, the electronic device 1600 according to various embodiments may include a transparent member 1610, a display panel 1620, and first and second anti-reflection layers 1650, 1660. Compared with the electronic device 700 shown in FIG. 7, the electronic device 1600 according to various embodiments may be formed in a curved shape. For example, the transparent member 1610 and the display panel 1620 of the electronic device 1600 may be configured to have first and second curvatures, respectively. The first and second curvatures may be the same or different from each other.

The transparent member 1610 according to various embodiments may include a first surface 1610a having the first curvature and facing toward a first direction, and a second surface 1610b facing toward a second direction opposite to the first direction and having the first curvature. The first surface 1610a of the transparent member 1610 may be an upper surface and a curved surface. The second surface 1610b of the transparent member 1610 may be a lower surface and a curved surface.

The transparent member 1610 according to various embodiments may be formed of glass or synthetic resin of a transparent material, and may be disposed on the outermost portion of the electronic device 1600. The transparent member 1610 may be disposed on most of the front surface or a portion of the front surface of the electronic device 1600 as a window of a transparent material.

The display panel 1620 according to various embodiments may be formed of a rigid material or a flexible material, and may include a first surface having the second curvature and facing toward the first direction, and a second surface facing toward the second direction opposite the first direction and having the second curvature. The first surface of the display panel 1620 may be an upper surface and the second surface may be a lower surface.

The display panel 1620 according to various embodiments may be housed in at least a portion of the housing of the electronic device 1600, and may be coupled to at least a portion of the transparent member 1610. The display panel 1620 may be coupled to the transparent member 1610 by a first adhesive member 1630. For example, the first adhesive member 1630 may be formed of a visually transparent material, and may be positioned between the transparent member 1610 and the display panel 1620 in the form of a layer. The display panel 1620 may be disposed on an edge region of a flat display region positioned on the front surface of the housing. For example, the display panel 1620 may be disposed on a left/right/upper/lower portion or left and right/upper and lower portions, or upper, lower, left, and right portions, along four sides of the flat display region disposed on the front surface of the housing.

The first anti-reflection layer 1650 according to various embodiments may belong to at least a portion of the transparent window (transparent member) positioned on the front surface region of the electronic device 1600. The second anti-reflection layer 1660 according to various embodiments may belong to at least a portion of the display panel 1620 of the electronic device. The first anti-reflection layer 1650 according to various embodiments may be disposed on the first surface 1610a of the transparent member 1610. The first anti-reflection layer 1650 may be disposed on the outermost portion of the electronic device 1600, and may be disposed on at least a portion of the front surface region of the electronic device 1600. For example, the first anti-reflection layer 1650 may be disposed on the upper surface of the transparent member by a deposition process, for example, a sputtering process. The first anti-reflection layer 1650 may be disposed to have the same curvature as the first curvature of the transparent member 1610.

The second anti-reflection layer 1660 according to various embodiments may be disposed on a second surface 1622b of a polarizing film layer 1622. The second anti-reflection layer 1650 may be disposed inside the electronic device 1600, and may be disposed on at least a portion of the display panel of the electronic device 1600. For example, the second anti-reflection layer 1660 may be disposed on the upper surface of the polarizing film layer 1622 by a deposition process, for example, a sputtering process. The second anti-reflection layer 1660 may be disposed to have the same curvature as the second curvature of the polarizing film layer 1622.

The display panel 1620 according to various embodiments may include the polarizing film layer 1622 and a light emitting layer 1624. The polarizing film layer 1622 may include a first surface 1622a facing toward the first direction and the second surface 1622b facing toward the second direction opposite the first direction. The first surface 1622a may be an upper surface of the polarizing film layer 1622, and the second surface 1622b may be a lower surface of the polarizing film layer 1622. The polarizing film layer 1622 may be disposed under the transparent member 1610 in the form of a layer, and may be configured as an optical member to allow only a specific component of light emitting from the light emitting layer 1624 to pass therethrough. The first surface 1622a of the polarizing film layer 1622 may have a curved surface having the second curvature, and the second surface 1622b may also have a curved surface having the second curvature. For example, the polarizing film layer 1622 may be formed of a flexible material.

The light emitting layer 1624 according to various embodiments may include at least a portion of an OLED, for example, as a member emitting light. The light emitting layer 1624 may be coupled to the second anti-reflection layer 1660 by a second adhesive member 1640. The second adhesive member 1640 may be formed of the same material as that of the first adhesive member 1630. For example, the light emitting layer 1624 may be formed of a flexible material.

The transparent member 1610 according to various embodiments may be disposed between the first anti-reflection layer 1650 and the polarizing film layer 1622, may be disposed between the first anti-reflection layer 1650 and the first adhesive member 1630, and may be disposed between the first and second anti-reflection layer 1650, 1660.

A thick arrow 1601 indicates that light emitting from the light emitting layer 1624 is guided to the outside, and indicates a quantity of transmitted light. Light emitting from the light emitting layer 1624 may be guided to the outside through the second anti-reflection layer 1660, the polarizing film layer 1622, the transparent member 1610, and the first anti-reflection layer 1650, and about 48-48.5% of the light may be transmitted and guided to the outside.

As a result, the electronic device according to various embodiments (FIGS. 7, 15, 16) of the present disclosure may allow the most light to be transmitted to the outside from the light emitting layer when the first anti-reflection layer is disposed on the first surface of the transparent member and the second anti-reflection layer is disposed on the second surface of the polarizing film layer, or the first anti-reflection layer is disposed on the first surface of the transparent member and the second anti-reflection layer is disposed on the first surface of the light emitting layer. According to this result, the display panel according to various embodiments of the present disclosure can reduce current consumption in comparison to related display panels.

Embodiments disclosed in the present disclosure are suggested for easy explanation and understanding of the technical features disclosed herein and are not intended to limit the scope of various embodiments of the present disclosure. Therefore, the scope of various embodiments of the present disclosure should be interpreted as including all changes based on the technical idea of various embodiments of the present disclosure or various other embodiments.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing;
   a transparent member, disposed in at least a portion of the housing, comprising an upper surface and a lower surface;
   a first anti-reflection layer coupled to the upper surface of the transparent member; and
   a display panel coupled to the lower surface of the transparent member by a visually transparent adhesive member, the display panel housed in the housing,
   wherein the display panel comprises:
      a polarizing film layer, coupled to the adhesive member, comprising an upper surface and a lower surface,
      a light emitting layer disposed under the lower surface of the polarizing film layer, and
      a second anti-reflection layer disposed on the lower surface of the polarizing film layer between the lower surface of the polarizing film layer and the light emitting layer.

2. The electronic device of claim 1, wherein the transparent member comprises glass or synthetic resin.

3. The electronic device of claim 2, wherein the transparent member comprises a front surface of the electronic device.

4. The electronic device of claim 1, wherein the second anti-reflection layer is disposed between the adhesive member and the light emitting layer.

5. The electronic device of claim 1, wherein the second anti-reflection layer is directly deposited onto the lower surface of the polarizing film layer.

6. The electronic device of claim 1, wherein the transparent member and the polarizing film layer are positioned between the first and second anti-reflection layers.

7. The electronic device of claim 1, wherein the transparent member comprises cover glass disposed on an outermost portion of a front surface of the electronic device.

8. The electronic device of claim 1, wherein the display panel is formed to be rigid or flexible.

9. The electronic device of claim 1, wherein the display panel comprises a flat display, a curved display, or a combination thereof.

10. The electronic device of claim 1, wherein the transparent member comprises a flat shape, a curved shape, or a combination thereof.

11. The electronic device of claim 10, wherein the display panel comprises:
    a flat display panel; and
    a curved display panel positioned on at least one edge of the flat display panel.

12. The electronic device of claim 1, wherein the display panel comprises an OLED.

13. The electronic device of claim 1, wherein the light emitting layer comprises an OLED.

14. An electronic device comprising:
    a front surface transparent window comprising an outer surface and an inner surface; and
    a display panel coupled to the inner surface of the front surface transparent window by a visually transparent adhesive member,
    wherein:
       a first anti-reflection layer is disposed on the front surface transparent window, and
       a second anti-reflection layer is disposed on the display panel.

15. The electronic device of claim 14, wherein the display panel comprises:
    a polarizing film layer, coupled to the adhesive member, comprising an upper surface and a lower surface; and
    a light emitting layer disposed under the lower surface of the polarizing film layer.

16. The electronic device of claim 15, wherein:
    the first anti-reflection layer is deposited onto the outer surface of the front surface transparent window, and
    the second anti-reflection layer is deposited onto the lower surface of the polarizing film layer.

17. A display device comprising:
    a transparent member comprising a first surface in a first direction, and a second surface in a second direction opposite the first direction;
    a first anti-reflection layer disposed on the first surface of the transparent member; and
    a display panel coupled to the second surface of the transparent member by a visually transparent adhesive member, wherein the display panel comprises:
- a polarizing film, coupled to the adhesive member, comprising a first surface in the first direction, and a second surface in the second direction opposite the first direction,
- a light emitting layer disposed under the second surface of the polarizing film, and
- a second anti-reflection layer disposed on the second surface of the polarizing film between the second surface of the polarizing film and the light emitting layer.

18. The display device of claim 17, wherein the transparent member comprises tempered glass disposed on a front surface of an electronic device.

19. The display device of claim 17, wherein the transparent member and the polarizing film are positioned between the first and second anti-reflection layers.

20. The display device of claim 17, wherein the display panel comprises:
- a flat display panel; and
- a curved display panel positioned on at least one edge of the flat display panel.

* * * * *